United States Patent
Lee et al.

(10) Patent No.: US 6,436,774 B1
(45) Date of Patent: Aug. 20, 2002

(54) METHOD FOR FORMING VARIABLE-K GATE DIELECTRIC

(75) Inventors: James Yong Meng Lee, Singapore (SG); Ying Keung Leung, Hong Kong (HK); Yelehanka Ramachandramurthy Pradeep; Jia Zhen Zheng, both of Singapore (SG); Lap Chan, San Francisco, CA (US); Elgin Quek, Singapore (SG); Ravi Sundaresan, San Jose, CA (US); Yang Pan, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/769,811

(22) Filed: Jan. 26, 2001

(51) Int. Cl.[7] .............................................. H01L 21/336
(52) U.S. Cl. ....................... 438/287; 438/435; 438/437; 257/206
(58) Field of Search .................................. 438/287, 437, 438/435, 692, 424; 257/506, 522, 368

(56) References Cited

U.S. PATENT DOCUMENTS

| | | | |
|---|---|---|---|
| 4,196,507 A | 4/1980 | Baptiste | 29/571 |
| 5,510,645 A * | 4/1996 | Fitch et al. | 257/522 |
| 5,677,217 A | 10/1997 | Tseng | 437/45 |
| 5,920,103 A | 7/1999 | Fulford et al. | 257/408 |
| 5,952,700 A | 9/1999 | Yoon | 257/405 |
| 6,008,109 A * | 12/1999 | Fulford, Jr. et al. | 438/437 |
| 6,140,691 A * | 10/2000 | Gardner et al. | 257/506 |
| 2001/0020723 A1 * | 9/2001 | Gardner et al. | 257/368 |

* cited by examiner

Primary Examiner—John F. Niebling
Assistant Examiner—Olivia T Luk
(74) Attorney, Agent, or Firm—George O. Saile; Stephen B. Ackerman

(57) ABSTRACT

A method for forming a gate dielectric having regions with different dielectric constants. A low-K dielectric layer is formed over a semiconductor structure. A dummy dielectric layer is formed over the low-K dielectric layer. The dummy dielectric layer and low-K dielectric layer are patterned to form an opening. The dummy dielectric layer is isontropically etched selectively to the low-K dielectric layer to form a stepped gate opening. A high-K dielectric layer is formed over the dummy dielectric and in the stepped gate opening. A gate electrode is formed on the high-K dielectric layer.

10 Claims, 2 Drawing Sheets

METHOD FOR FORMING VARIABLE-K GATE DIELECTRIC

BACKGROUND OF INVENTION

1) Field of the Invention

This invention relates generally to fabrication of a semiconductor device and more particularly to a method for forming a gate dielectric with areas having different dielectric constants.

2) Description of the Prior Art

In MOS (metal on silicon) transistor technology, a gate dielectric is formed on a silicon substrate, and a gate electrode is formed over the gate dielectric. Source and drain regions are formed adjacent the gate electrode and the gate dielectric. When a voltage is applied to the gate electrode, electrons (NMOS) or holes (PMOS) flow across the region of the silicon substrate under the gate dielectric, known as the channel. As the channel length decreases, the electrons in an NMOS transistor gain sufficient energy from the electric field to enter the gate dielectric layer where they become trapped, changing the gate threshold voltage (e.g. hot carrier effect).

To reduce the hot carrier effect, a lightly doped drain region LDD is formed between the channel and the source/drain, lowering the electric field. However, the reduced impurity concentration in the LDD causes parasitic resistance, reducing drive current and slowing down the transistor.

Another problem with LDD structured MOS transistors is that the overlap of the gate electrode over the LDD regions with a thin gate dielectric between them causes capacitance, called overlap capacitance, which further slows the transistor.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,952,700 (Yoon) shows a process for forming a two-layer gate dielectric on one side of the gate.

U.S. Pat. No. 5,677,217 (Tseng) shows a gate process where a LDD structure is formed only on the drain side of a gate, and a two-layer insulator is formed only at the drain side of a gate using an opening in an insulator layer or an offset mask.

U.S. P at. No. 4,196,507 (Baptiste) shows a process for forming a transistor gate using a lateral etch to undercut the oxide over the channel region to provide a mask for a threshold adjust implant.

U.S. Pat No. 5,920,103 (Fulford et al.) shows a method to modify the gate dielectric on the drain side edge using an RTA.

SUMMARY OF THE INVENTION

It is an object of the present invention to provide a method for forming a gate dielectric having regions of varying dielectric constant.

It is another object of the present invention to provide a method for increasing drive current in a gate channel while reducing hot carrier effects and overlap capacitance.

It is yet another object of the present invention to provide a method for reducing channel length without causing detrimental short channel effects and overlap capacitance.

To accomplish the above objectives, the present invention provides a method for forming a gate dielectric having regions with different dielectric constants. A low-K dielectric layer is formed over a semiconductor structure. A dummy dielectric layer is formed over the low-K dielectric layer. The dummy dielectric layer and low-K dielectric layer are patterned to form an opening. The dummy dielectric layer is isotropically etched selectively to the low-K dielectric layer to form a stepped gate opening. A high-K dielectric layer is formed over the dummy dielectric and in the stepped gate opening. A gate electrode is formed on the high-K dielectric layer.

The present invention provides considerable improvement over the prior art. A gate dielectric can be formed having regions with different dielectric constants. The high-K dielectric region allows the drive current in a gate channel to be increased. The low-K dielectric regions at the edges of the gate electrode reduce hot carrier effects and overlap capacitance. The gate dielectric of the present invention provides a method for reducing channel length without causing detrimental short channel effects and overlap capacitance.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for forming a gate dielectric having regions with different dielectric constants. At the edges of the channel, where hot carrier effects are most likely to occur, the gate dielectric comprises both a high-K and a low-K dielectric region. In the middle of the channel, the gate dielectric comprises only a high-K dielectric region allowing drive current with reduced overlap capacitance.

Figure 1:
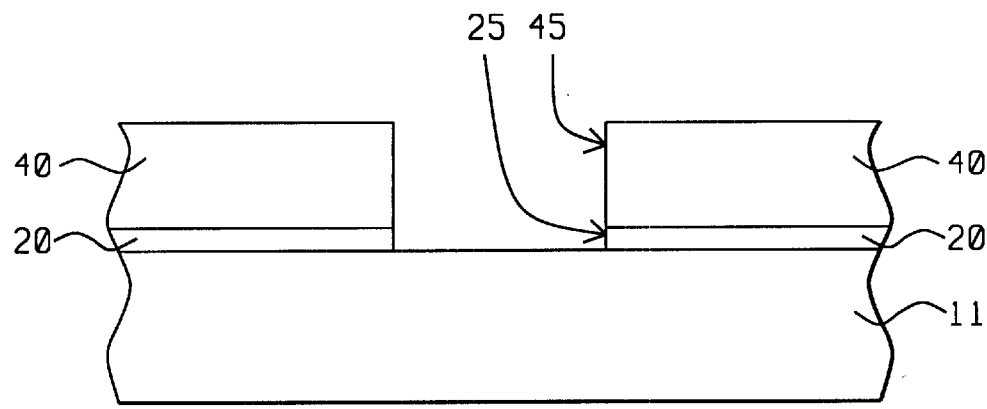
FIGS. 1 through 6 illustrate sequential sectional views of a process for forming a gate dielectric having regions with different dielectric constants according to the present invention.

Referring to FIG. 1, the present invention begins by providing a semiconductor structure (11). Semiconductor structure (11) should be understood to possibly include a wafer or substrate of semiconducting material, such as monocrystalline silicon, or a similar structure now known or later developed, such as a silicon-on-insulator (SOI) structure. Semiconductor structure (11) should be further understood to possibly include one or more conductive and or insulating layers formed over the substrate or like structure, and one or more active and/or passive devices formed on or over the substrate or like structure.

Still referring to FIG. 1, a low-K dielectric layer (20) layer is formed over the semiconductor structure (11), and a dummy dielectric layer (40) is formed over the low-K dielectric layer (20). The low-K dielectric layer (20) will be used to form low-K regions at the edges of a gate dielectric. The low-K dielectric layer (20) preferably has a thickness of between about 30 angstroms and 100 angstroms and can comprise any low-K material that can be formed in such a thin layer, preferably fluorinated silicon dioxide, carbon doped silicon dioxide, or a low-K polymer. Low-K material should be understood to be a material having a dielectric constant less than 3.9.

The dummy dielectric layer (40) can comprise any dielectric material that can be etched selectively to the low-K dielectric layer (20). For example, over a fluorinated silicon dioxide low-K dielectric layer (20), the dummy dielectric layer (40) can comprise silicon nitride. The dummy dielectric layer should have a sufficient thickness for an intended gate electrode.

Still referring to FIG. 1, the dummy dielectric layer (40) and the low-K dielectric layer (20) are patterned to form a first gate opening (45) in the dummy dielectric layer (40) and a second gate opening (25) in the low-K dielectric layer (20). The first gate opening (45) and the second gate opening (25) are narrower than the desired width of the intended gate electrode. The second gate opening (25) preferably has a width of between about 0.06 microns and 0.48 microns.

Figure 2:
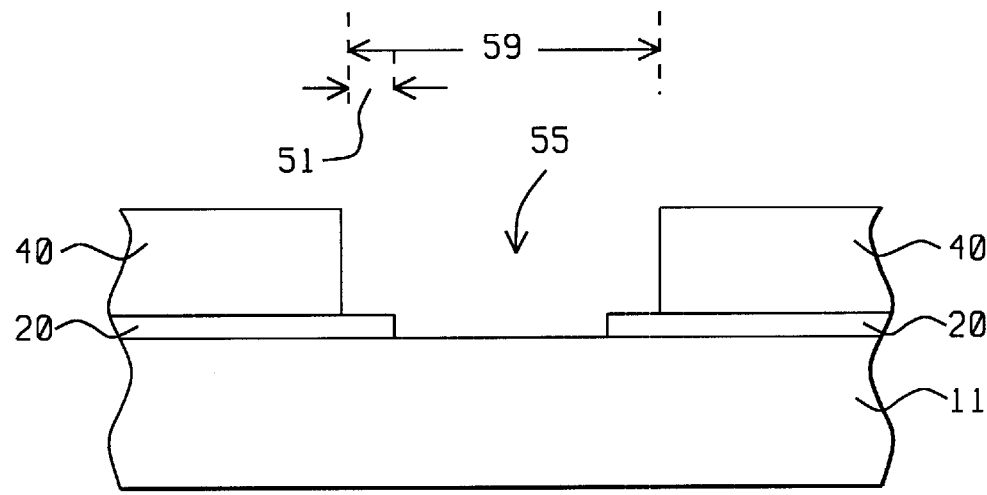

Referring now to FIG. 2, the dummy dielectric layer (40) is isotropically etched selectively to the low-K dielectric layer (20) to open the first gate opening (45). The selective, isotropic etch forms a stepped gate opening (55). For a dummy dielectric layer (40) comprising silicon nitride and a low-K dielectric layer (20) comprising fluorinated silicon dioxide, the selective, isotropic etch can be performed with hot phosphoric acid. The stepped opening (55) preferably has an stepped opening width (59) of between about 0.08 microns and 0.50 microns with a step width (51) of between about 0.01 microns and 0.02 microns.

Figure 3:
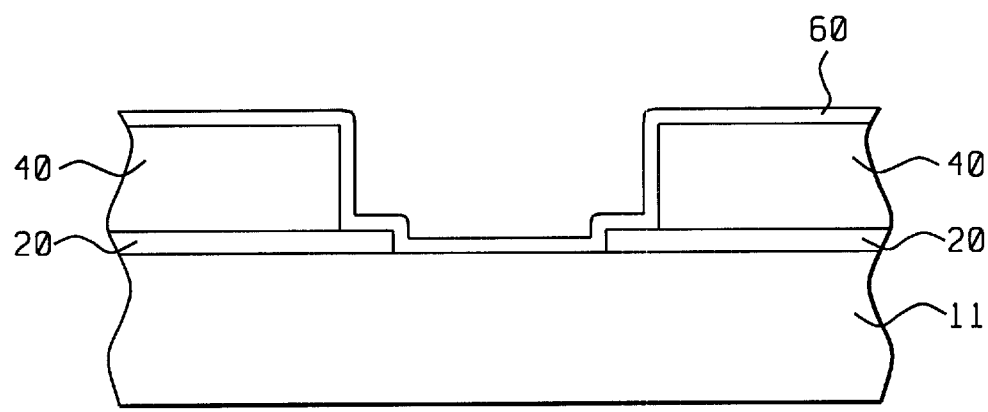

Referring now to FIG. 3, a high-K dielectric layer (60) is formed over the dummy dielectric layer (40) and in the stepped gate opening (55). The high-K dielectric layer (60) can comprise any of a the presently-known or later-developed high-K materials, including but not limited to. $ZrO_2$, $Ta_2O_5$, $TiO_2$, $Si_3N_4$, $ZrSiO_4$, or $Al_2O_3$, and most preferably $ZrSiO_4$. The high-K dielectric layer (60) is preferably formed to a thickness of between about 10 angstroms and 100 angstroms by sputtering. High-K material should be understood to be material having a dielectric constant of greater than 3.9, and preferably greater than 8.0.

Figure 4:
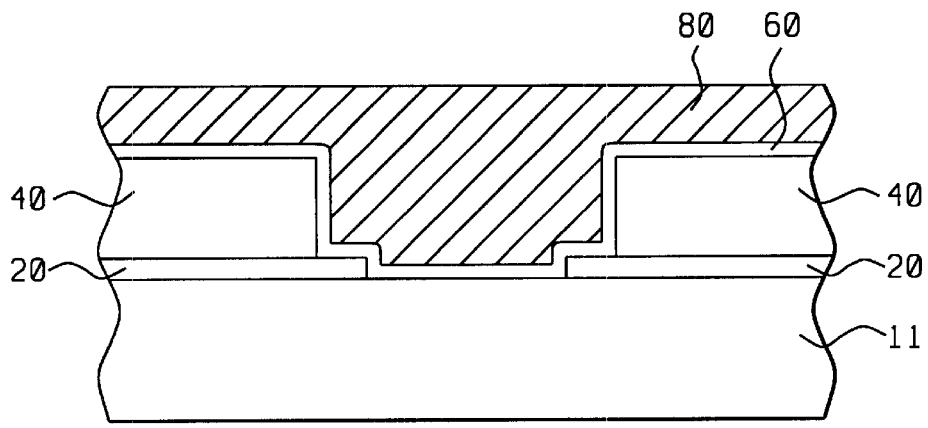

Referring now to FIG. 4, a gate electrode layer (80) is formed over the high-K dielectric layer (60). The gate electrode layer can comprise a metal, polysilicon, or a stack of metal and/or polysilicon films, as is known in the art. The gate electrode layer has a sufficient thickness to overfill the stepped opening (55).

Figure 5:
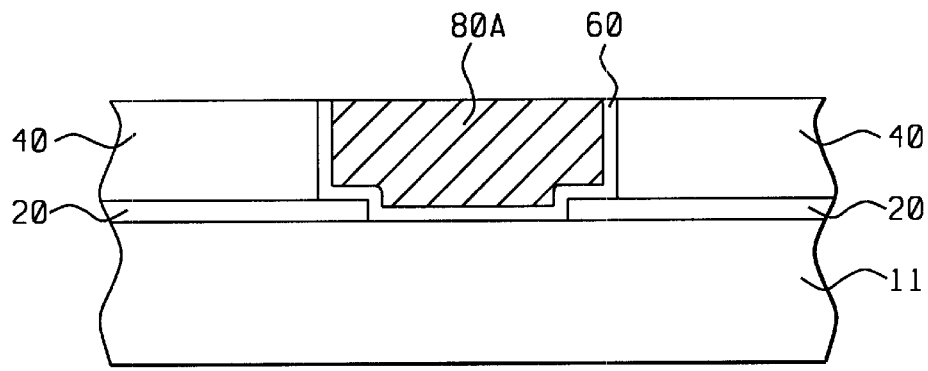

As shown in FIG. 5, the gate electrode layer (80) and the high-K dielectric layer (60) are planarized stopping on the dummy dielectric layer (40) to form a gate electrode (80A). The planarization is most preferably performed using a chemical-mechanical polishing (CMP) process as is known in the art. The dummy dielectric layer (40) preferably acts as a CMP stop.

Figure 6:
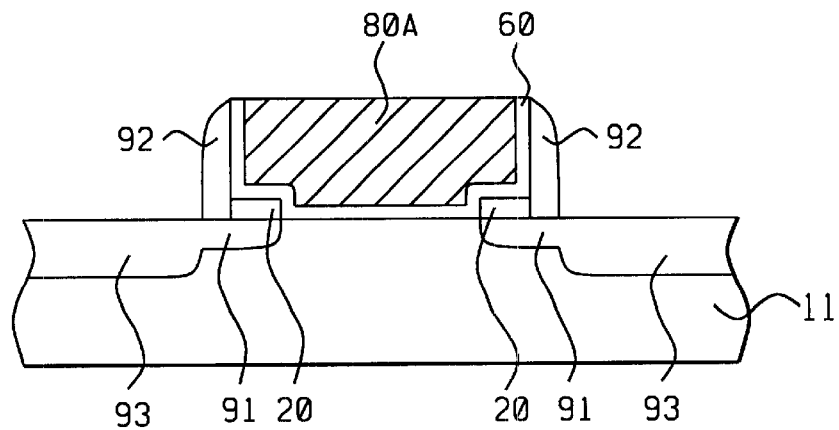

Referring now to FIG. 6, the dummy dielectric layer together with the low-K dielectric layer beneath it (not shown) are removed, preferably using an etch which etches the dummy dielectric selectively to the high-K dielectric layer (60). For example, a dummy dielectric layer comprising silicon nitride can be etched selectively to a high-K dielectric layer comprising $ZrO_2$ (zirconium dioxide).

Lightly doped source and drain regions (LDDs) (91) can be formed in the semiconductor structure (11) adjacent the gate electrode (80A) by an impurity ion implant and diffusion anneal as is known in the art. Spacers (92) can be formed adjacent the gate electrode (80A) as is known in the art. Source and drain regions can then be formed in the semiconductor structure (11) adjacent the spacers (92). Following lightly doped source and drain region formation, the low-K dielectric layer (20) extends over at least a portion of the lightly doped source and drain regions. Preferably the low-K dielectric layer (20) extends a distance of within 10% of the length of the lightly doped source and drain regions. Most preferably, the low-K dielectric layer (20) extends a distance of about the length of the lightly doped source and drain regions.

The key advantages of the present invention are that a gate dielectric is formed having regions with different dielectric constants. The gate dielectric of the present invention provides a method for increasing drive current in a gate channel while reducing hot carrier effects and overlap capacitance.

While the invention has been particularly shown and described with reference to the preferred embodiments thereof, it will be understood by those skilled in the art that various changes in form and details may be made without departing from the spirit and scope of the invention.

What is claimed is:

1. A method for forming a gate dielectric, comprising the steps of:

a. forming a low-K dielectric layer over a semiconductor structure;

b. forming a dummy dielectric layer over said low-K dielectric layer;

c. patterning said dummy dielectric layer and low-K dielectric layer to form a first gate opening in said dummy dielectric layer and a second gate opening in said low-K dielectric layer;

d. isotropically etching said dummy dielectric layer selectively to said low-K dielectric layer to open said first gate opening, forming a stepped gate opening;

e. forming a high-K dielectric layer over said dummy dielectric and in said stepped gate opening; and f. forming a gate electrode on said high-K dielectric layer.

2. The method of claim 1 wherein said low-K dielectric layer comprises fluorinated silicon dioxide.

3. The method of claim 1 wherein said high-K dielectric comprises $ZrSiO_4$.

4. The method of claim 1 wherein said high-K dielectric comprises $ZrO_2$, $Ta_2O_5$, $TiO_2$, $Si_3N_4$, or $Al_2O_3$.

5. The method of claim 1 wherein lightly doped source and drain regions are formed adjacent said gate electrode such that said low-K dielectric layer extends a distance of within 10% of the length of said lightly doped source and drain regions.

6. The method of claim 1 wherein lightly doped source and drain regions are formed adjacent said gate electrode such that said low-K dielectric layer extends a distance of about the length of the lightly doped source.

7. The method of claim 1 wherein said low-K dielectric layer has a thickness of between about 30 angstroms and 100 angstroms and said high-K dielectric ha s a thickness of between about 10 angstroms and 100 angstroms.

8. The method of claim 1 wherein said stepped opening has a width of between about 0.08 microns and 0.50 microns with a step width of between about 0.01 microns and 0.02 microns.

9. The method of claim 1 which further comprise the steps of:
  (g) removing the dummy dielectric layer;
  (h) forming lightly doped source and drain regions in said semiconductor structure adjacent said gate electrode;
  (i) forming spacers adjacent said gate electrode, and
  (j) forming source and drain regions in said semiconductor structure adjacent said spacers.

10. The method of claim 9 wherein said low-K dielectric layer extends over at least a portion of said lightly doped source and drain regions.

* * * * *